US011222818B2

United States Patent
Chao et al.

(10) Patent No.: US 11,222,818 B2
(45) Date of Patent: Jan. 11, 2022

(54) FORMATION METHOD OF SEMICONDUCTOR DEVICE STRUCTURE WITH METAL-SEMICONDUCTOR COMPOUND REGION

(71) Applicant: Taiwan Semiconductor Manufacturing Co., Ltd., Hsinchu (TW)

(72) Inventors: Yi-Hsiang Chao, New Taipei (TW); Min-Hsiu Hung, Tainan (TW); Chun-Wen Nieh, Zhubei (TW); Ya-Huei Li, Tainan (TW); Yu-Hsiang Liao, Hsinchu (TW); Li-Wei Chu, New Taipei (TW); Kan-Ju Lin, Kaohsiung (TW); Kuan-Yu Yeh, Taoyuan (TW); Chi-Hung Chuang, Changhua County (TW); Chih-Wei Chang, Hsin-Chu (TW); Ching-Hwanq Su, Tainan (TW); Hung-Yi Huang, Hsin-chu (TW); Ming-Hsing Tsai, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 87 days.

(21) Appl. No.: 16/034,843

(22) Filed: Jul. 13, 2018

(65) Prior Publication Data

US 2020/0020583 A1 Jan. 16, 2020

(51) Int. Cl.
*H01L 23/00* (2006.01)
*H01L 21/768* (2006.01)
(Continued)

(52) U.S. Cl.
CPC .. *H01L 21/76889* (2013.01); *H01L 21/26513* (2013.01); *H01L 21/28518* (2013.01);
(Continued)

(58) Field of Classification Search
CPC ......... H01L 21/76889; H01L 21/26513; H01L 21/28518
See application file for complete search history.

(56) References Cited

U.S. PATENT DOCUMENTS

| | | | |
|---|---|---|---|
| 2003/0015758 A1* | 1/2003 | Taylor, Jr. | ......... H01L 29/41766 257/368 |
| 2013/0171818 A1* | 7/2013 | Kim | ...................... H01L 21/285 438/664 |

(Continued)

*Primary Examiner* — Mounir S Amer
*Assistant Examiner* — Alexander Belousov
(74) *Attorney, Agent, or Firm* — Birch, Stewart, Kolasch & Birch, LLP

(57) ABSTRACT

A method for forming a semiconductor device structure is provided. The method includes forming a fin structure over a semiconductor substrate and forming a gate stack over the fin structure. The method also includes forming an epitaxial structure over the fin structure, and the epitaxial structure is adjacent to the gate stack. The method further includes forming a dielectric layer over the epitaxial structure and forming an opening in the dielectric layer to expose the epitaxial structure. In addition, the method includes applying a metal-containing material on the epitaxial structure while the epitaxial structure is heated so that a portion of the epitaxial structure is transformed to form a metal-semiconductor compound region.

18 Claims, 11 Drawing Sheets

(51) Int. Cl.
     *H01L 29/78*    (2006.01)
     *H01L 29/08*    (2006.01)
     *H01L 29/06*    (2006.01)
     *H01L 29/45*    (2006.01)
     *H01L 21/324*   (2006.01)
     *H01L 29/66*    (2006.01)
     *H01L 21/285*   (2006.01)
     *H01L 21/265*   (2006.01)
     *H01L 23/535*   (2006.01)

(52) U.S. Cl.
     CPC ...... *H01L 21/324* (2013.01); *H01L 21/76805* (2013.01); *H01L 21/76843* (2013.01); *H01L 21/76895* (2013.01); *H01L 23/535* (2013.01); *H01L 29/0653* (2013.01); *H01L 29/0847* (2013.01); *H01L 29/45* (2013.01); *H01L 29/66795* (2013.01); *H01L 29/7848* (2013.01); *H01L 29/7851* (2013.01)

(56) References Cited

U.S. PATENT DOCUMENTS

| | | | |
|---|---|---|---|
| 2015/0311342 A1* | 10/2015 | Lin | H01L 29/7848 |
| | | | 257/190 |
| 2016/0351446 A1* | 12/2016 | Yamaguchi | H01L 29/456 |
| 2017/0092502 A1* | 3/2017 | Mebarki | H01L 21/76885 |
| 2018/0175201 A1* | 6/2018 | Wang | H01L 29/66545 |
| 2019/0027479 A1* | 1/2019 | Wu | C23C 14/34 |

* cited by examiner

FORMATION METHOD OF SEMICONDUCTOR DEVICE STRUCTURE WITH METAL-SEMICONDUCTOR COMPOUND REGION

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
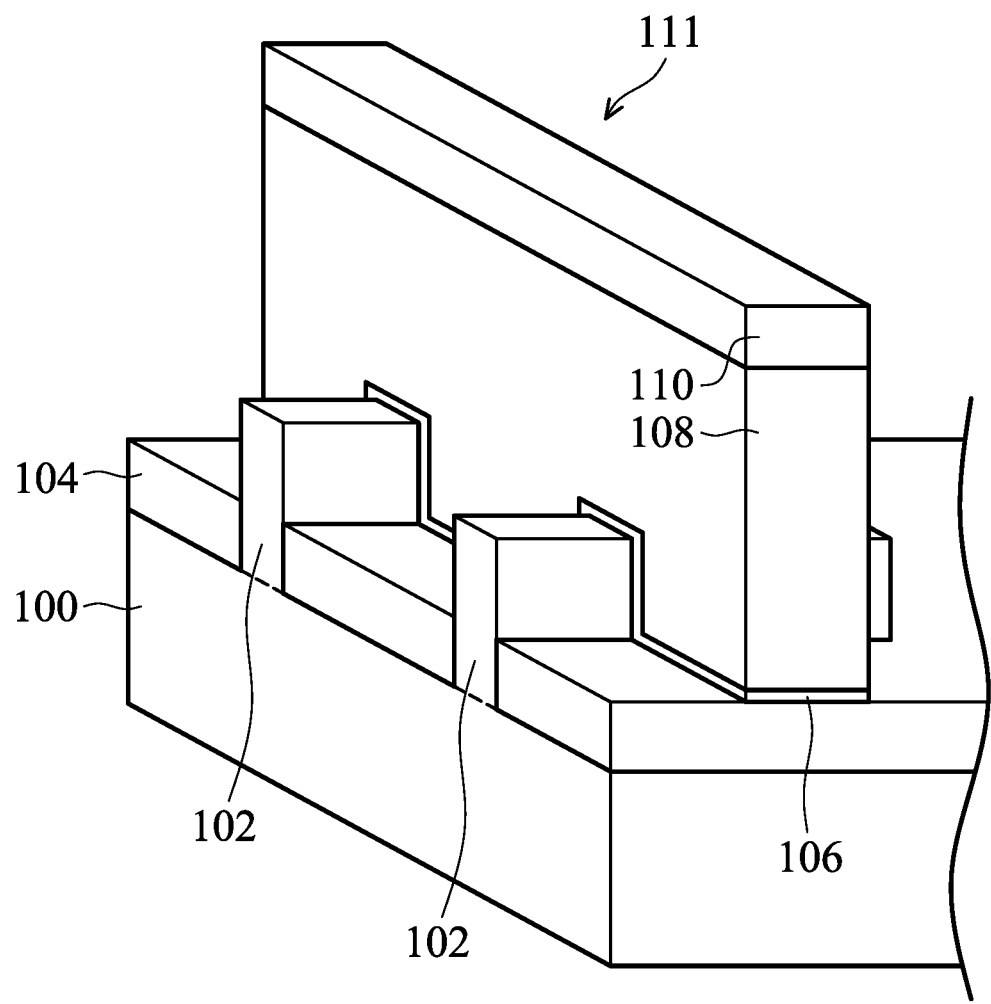
FIGS. 1A-1C are perspective views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
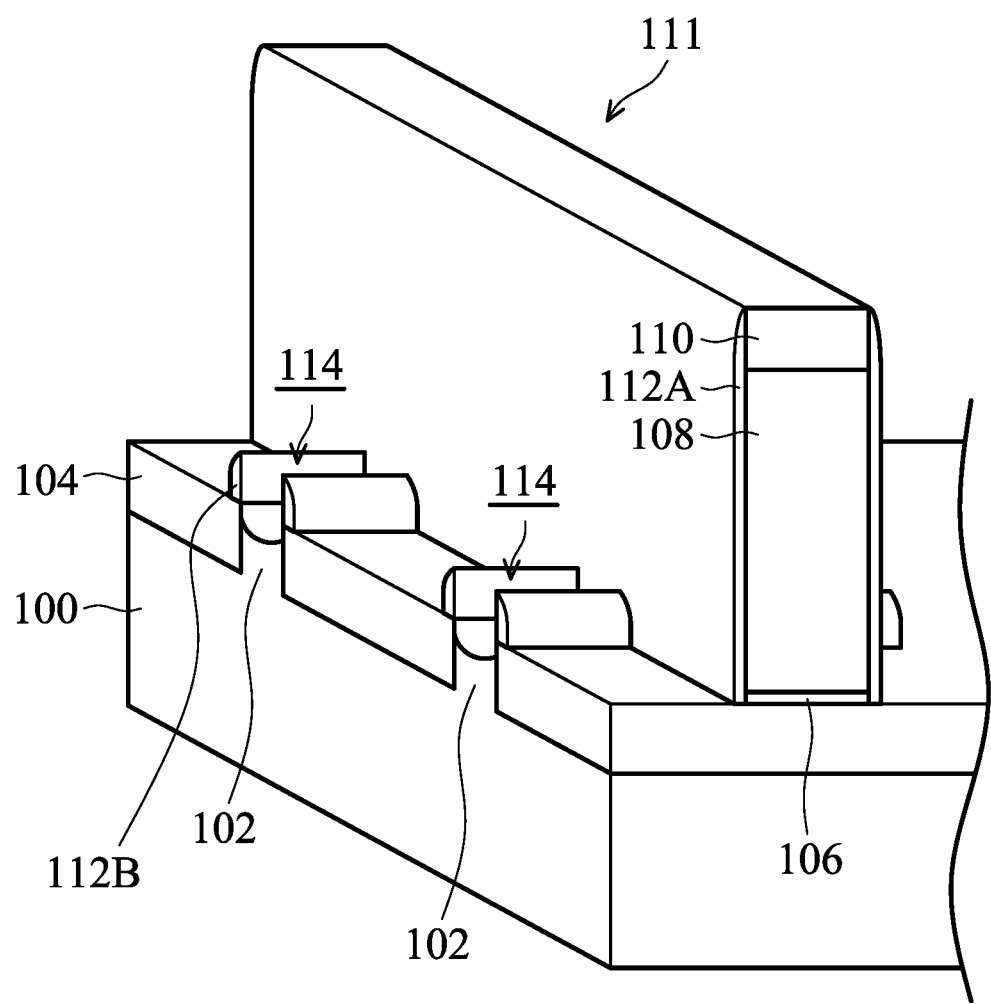
Figure 1C:
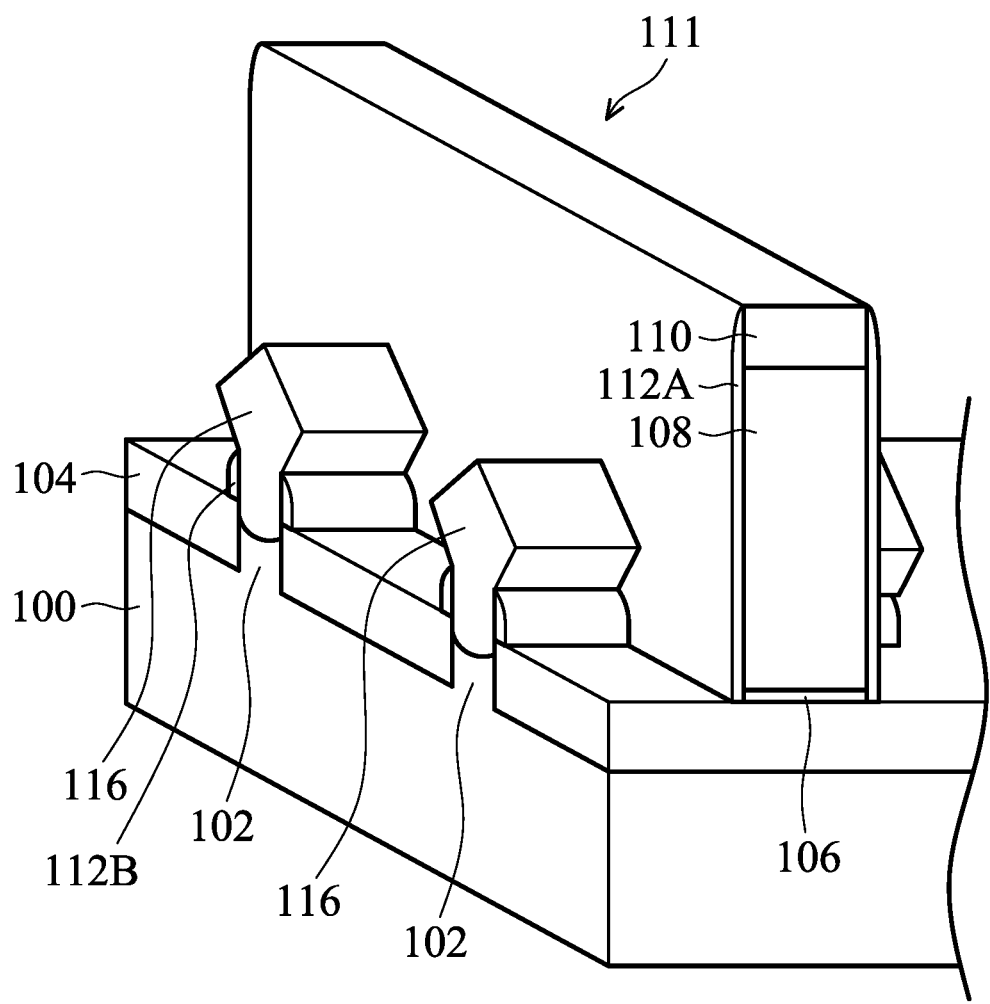

FIGS. 1A-1C are perspective views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof).

In some other embodiments, the semiconductor substrate 100 includes a compound semiconductor. The compound semiconductor may include silicon carbide, gallium arsenide, indium arsenide, indium phosphide, one or more other suitable compound semiconductors, or a combination thereof.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, multiple recesses (or trenches) are formed in the semiconductor substrate 100, in accordance with some embodiments. As a result, multiple fin structures 102 are formed or defined between the recesses. In some embodiments, one or more photolithography and etching processes are used to form the recesses. In some embodiments, the fin structures 102 are in direct contact with the semiconductor substrate 100.

However, embodiments of the disclosure have many variations and/or modifications. In some other embodiments, the fin structures 102 are not in direct contact with the semiconductor substrate 100. One or more other material layers may be formed between the semiconductor substrate 100 and the fin structures 102. For example, a dielectric layer may be formed between the semiconductor substrate 100 and the fin structures 102.

As shown in FIG. 1A, isolation features 104 are formed in the recesses to surround lower portions of the fin structures 102, in accordance with some embodiments. The isolation features 104 are used to define and electrically isolate various device elements formed in and/or over the semiconductor substrate 100. In some embodiments, the isolation features 104 include shallow trench isolation (STI) features, local oxidation of silicon (LOCOS) features, another suitable isolation feature, or a combination thereof.

In some embodiments, each of the isolation features 104 has a multi-layer structure. In some embodiments, the isolation features 104 are made of a dielectric material. The dielectric material may include silicon oxide, silicon nitride, silicon oxynitride, fluoride-doped silicate glass (FSG), low-K dielectric material, one or more other suitable materials, or a combination thereof. In some embodiments, an STI liner (not shown) is formed to reduce crystalline defects at the interface between the semiconductor substrate 100 and the isolation features 104. Similarly, the STI liner may also be used to reduce crystalline defects at the interface between the isolation features 104 and the fin structures 102.

In some embodiments, a dielectric material layer is deposited over the semiconductor substrate 100. The dielectric material layer covers the fin structures 102 and fills the recesses between the fin structures. The dielectric material layer may be deposited using a chemical vapor deposition (CVD) process, an atomic layer deposition (ALD) process, a physical vapor deposition (PVD) process, a spin-on process, one or more other applicable processes, or a combination thereof. In some embodiments, a planarization process is then used to thin down the dielectric material layer until the fin structures 102 or hard mask elements defining the fin structures are exposed. The planarization process may include a chemical mechanical polishing (CMP) process, a grinding process, a dry polishing process, an etching process, one or more other applicable processes, or a combination thereof. Afterwards, the dielectric material layer is etched back such that the fin structures 102 protrude from the top surface of the remaining dielectric material layer after the etching process. As a result, the remaining portions of the dielectric material layer form the isolation features 104, as shown in FIG. 1A.

Afterwards, a gate stack 111 is formed over the semiconductor substrate 100 to partially cover the fin structures 102, as shown in FIG. 1A in accordance with some embodiments. The gate stack 111 includes a gate electrode 108 and a gate dielectric layer 106. In some embodiments, a gate dielectric material layer and a gate electrode material layer are deposited over the isolation features 104 and the fin structures 102. Afterwards, the gate dielectric material layer and the gate electrode material layer are patterned to form the gate stack 111 including the gate electrode 108 and the gate dielectric layer 106.

In some embodiments, the gate dielectric material layer is made of or includes silicon oxide, silicon nitride, silicon oxynitride, dielectric material with a high dielectric constant (high-K), one or more other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. In some embodiments, the gate dielectric material layer is a dummy gate dielectric layer which will be removed subsequently. The dummy gate dielectric material layer is, for example, a silicon oxide layer.

In some embodiments, the gate dielectric material layer is deposited using a chemical vapor deposition (CVD) process, an atomic layer deposition (ALD) process, a thermal oxidation process, a physical vapor deposition (PVD) process, one or more other applicable processes, or a combination thereof.

In some embodiments, the gate electrode material layer is a dummy gate electrode layer and is made of or includes a semiconductor material such as polysilicon. For example, the dummy gate electrode layer is deposited using a CVD process or another applicable process.

Afterwards, a patterned hard mask element 110 is formed over the gate electrode material layer, in accordance with some embodiments. The patterned hard mask element 110 is used to pattern the gate electrode material layer and the gate dielectric material layer into the gate stack 111. Afterwards, the gate electrode material layer and the gate dielectric material layer are etched with the patterned hard mask element 110 as an etching mask. As a result, the gate stack 111 is formed, as shown in FIG. 1A in accordance with some embodiments.

As shown in FIG. 1B, spacer elements 112A are formed over sidewalls of the gate stack 111, in accordance with some embodiments. The spacer elements 112A may be used to assist in the formation of source and drain structures (or regions) in subsequent processes. In some embodiments, the spacer elements 112A are made of or include silicon nitride, silicon oxynitride, silicon carbide, silicon carbon oxynitride, one or more other suitable materials, or a combination thereof.

In some embodiments, a spacer layer is deposited over the semiconductor substrate 100, the fin structures 102, and the gate stack 111. The spacer layer may be deposited using a CVD process, an ALD process, a PVD process, a spin-on process, one or more other applicable processes, or a combination thereof. Afterwards, an etching process, such as an anisotropic etching process, is performed to partially remove the spacer layer. As a result, the remaining portions of the spacer layer over the sidewalls of the gate stack 111 form the spacer elements 112A. Other remaining portions of the spacer layer over the sidewalls of the fin structures 102 form support elements 112B. The support elements 112B may be used to assist in the growth of source and drain structures (or regions) in subsequent processes.

Many variations and/or modifications can be made to embodiments of the disclosure. In some other embodiments, the support elements 112B are not formed.

As shown in FIG. 1B, the fin structures 102 are partially removed to form recesses 114, in accordance with some embodiments. In some embodiments, the fin structures 102 are recessed to a level below the tops of the support elements 112B. In some embodiments, the fin structures 102 are recessed to a level below the top surfaces of the isolation features 104. In some embodiments, an etching process is used to form the recesses 114.

Many variations and/or modifications can be made to embodiments of the disclosure. In some other embodiments, the fin structures 102 are not recessed. In some other embodiments, the fin structures 102 are merely thinned without being recessed to a level below the top surfaces of the isolation features 104.

As shown in FIG. 1C, one or more semiconductor materials are epitaxially grown over the fin structures 102, in accordance with some embodiments. As a result, epitaxial structures 116 are formed. The epitaxial structures 116 may function as source and drain structures. The epitaxial structures 116 may also function as stressors to improve carrier mobility.

In some embodiments, the epitaxial structures 116 are made of one or more p-type semiconductor materials. For example, the epitaxial structures 116 may include epitaxially grown silicon germanium. In some other embodiments, the epitaxial structures 116 are made of one or more n-type semiconductor materials. The epitaxial structures 116 may include epitaxially grown silicon, epitaxially grown silicon carbide (SiC), epitaxially grown silicon phosphide (SiP), or another suitable epitaxially grown semiconductor material.

In some embodiments, the epitaxial structures 116 are formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, an ALD process, one or more other applicable processes, or a combination thereof. The formation process of the epitaxial structures 116 may use gaseous and/or liquid precursors.

In some embodiments, the epitaxial structures 116 include dopants. For example, the epitaxial structures 116 are p-type doped, and the dopants may include boron. In some embodiments, the epitaxial structures 116 are doped in-situ during the growth of the epitaxial structures 116. In some other embodiments, the epitaxial structures 116 are not doped during the growth of the epitaxial structures 116. In some embodiments, one or more implantation processes are used to dope the epitaxial structures 116. After the epitaxial growth, the epitaxial structures 116 are doped in a subsequent process.

In some embodiments, the doping is achieved using an ion implantation process, a plasma immersion ion implantation process, a gas and/or solid source diffusion process, one or more other applicable processes, or a combination thereof. In some embodiments, the epitaxial structures 116 are further exposed to one or more annealing processes to activate the dopants. For example, a rapid thermal annealing process is used.

Figure 2A:
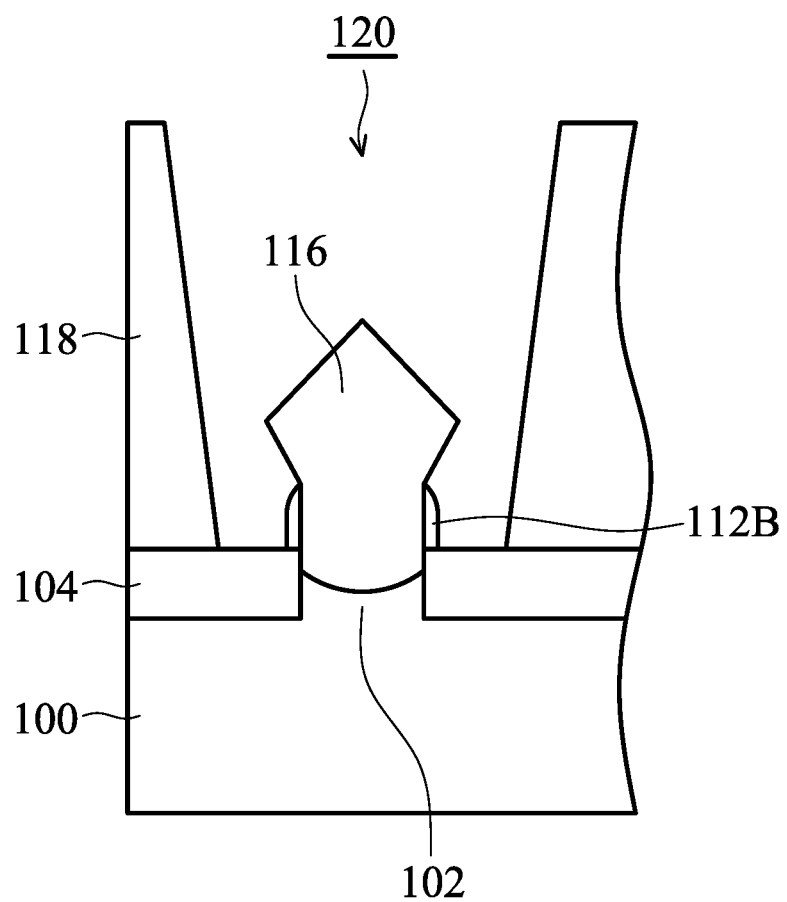
FIGS. 2A-2F are cross-sectional views of various stages of a process for forming a semiconductor device structure, in accordance with some embodiments.

FIGS. 2A-2F are cross-sectional views of various stages of a process for forming a semiconductor device structure, in accordance with some embodiments. In some embodiments, FIGS. 2A-2F show some subsequent processes performed on the structure shown in FIG. 1C. FIG. 2A shows a formation of a contact opening 120 in a dielectric layer 118, in accordance with some embodiments. The contact opening 120 exposes one of the epitaxial structures 116. In some other embodiments, the contact opening 120 exposes two or more of the epitaxial structures 116.

The cross-sectional view of FIG. 2A may show the cross-sectional view of the epitaxial structure 116 after the formation of the dielectric layer 118 and the contact opening 120. The cross-sectional view of FIG. 2A may be taken along a line that is substantially perpendicular to an elongation direction of the fin structure 102.

Before the formation of the contact opening 120, a gate replacement process may be performed. In some embodiments, a dielectric material layer is deposited over the epitaxial structures 116, the isolation features 104, and the gate stack 111, in accordance with some embodiments. The dielectric material layer may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof. In some embodiments, the dielectric material layer is deposited using a CVD process, an ALD process, a PVD process, a spin-on process, one or more other applicable processes, or a combination thereof.

Afterwards, the dielectric material layer is thinned until or after the gate stack 111 is exposed. The dielectric material layer may be thinned until the hard mask element 110 is exposed. Alternatively, the dielectric material layer may be thinned until the gate electrode 108 is exposed. After the thinning process of the dielectric material layer, the remaining portion of the dielectric material layer forms the dielectric layer 118. The dielectric layer 118 covers the epitaxial structures 116 before the formation of the contact opening 120. The dielectric layer 118 also surrounds the gate stack 111.

Afterwards, a gate replacement process may be performed. The gate stack 111 is removed to form a trench. Then, a metal gate stack is formed in the trench. The metal gate stack may include a high-k gate dielectric layer, a work function layer, and a metal filling.

After the formation of the metal gate stack, the dielectric layer 118 is partially removed to form the contact opening 120 that exposes one or more of the epitaxial structures 116, as shown in FIG. 2A in accordance with some embodiments. The contact opening 120 may be formed using a photolithography process and an etching process.

Figure 2B:
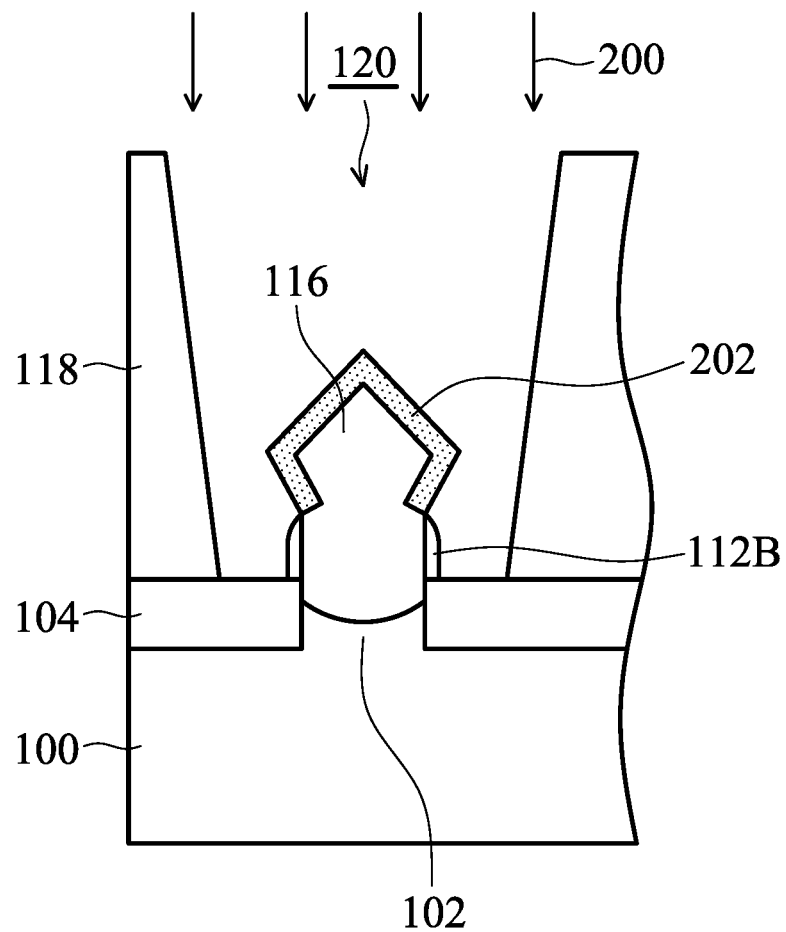

As shown in FIG. 2B, a modified region 202 is formed in the epitaxial structure 116, in accordance with some embodiments. In some embodiments, the modified region 202 extends along the entirety of the exposed surface of the epitaxial structure 116. In some embodiments, the modified region 202 has lower crystallinity than an inner portion of the epitaxial structure 116. The lower crystallinity of the modified region 202 may facilitate the subsequent formation of a metal-semiconductor region.

The metal-semiconductor region may be made of or include a metal silicide layer that helps to reduce resistance between the epitaxial structure 116 and a conductive contact to be formed over the epitaxial structure 116. In some embodiments, the modified region 202 includes an amorphous region, a polycrystalline region, or a combination thereof. In some embodiments, the inner portion of the epitaxial structure 116 is a single crystalline structure. In some embodiments, the modified region 202 has a smaller average grain size than that of the inner portion of the epitaxial structure 116.

In some embodiments, the modified region 202 is formed using an implantation process 200. The implantation process 200 may be an ion implantation process. In some embodiments, the implantation process 200 is a plasma doping (PLAD) process. Plasma may be introduced into the contact opening 120 to form the modified region 202. In some embodiments, reaction gas used in the implantation process 200 includes silicon-containing gas, germanium-containing gas, argon-containing gas, helium-containing gas, one or more other suitable gases, or a combination thereof. The implantation process 200 may help to reduce the crystallinity of the modified region 202, which allows a subsequently deposited formed metal material to react with the modified region 202 more easily.

Many variations and/or modifications can be made to embodiments of the disclosure. In some other embodiments, the implantation process 200 is not performed. In some other embodiments, the modified region 202 is not formed.

Figure 2C:
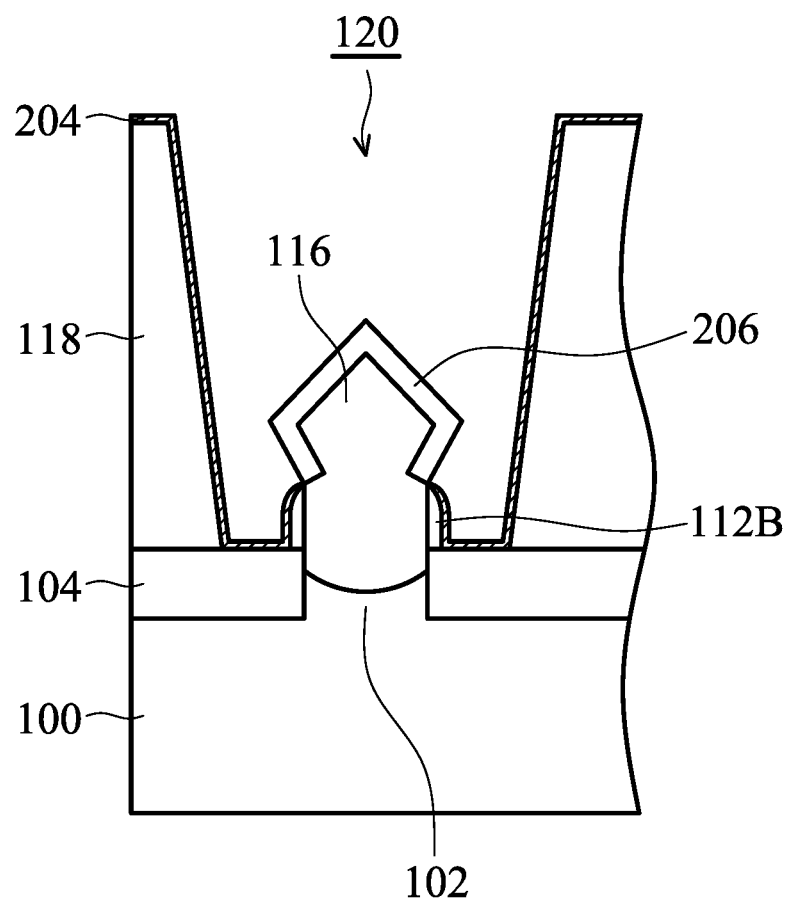

As shown in FIG. 2C, a metal-containing material is applied (or deposited) on the epitaxial structure 116 while the epitaxial structure 116 is heated, in accordance with some embodiments. Because the metal-containing material is applied during the heating of the epitaxial structure, the thermal energy may help to initiate chemical reaction between the surface portion of the epitaxial structure 116 and the metal-containing material. As a result, a surface portion of the epitaxial structure 116 reacts with the metal-containing material and is transformed into a metal-semiconductor compound region 206.

The metal-semiconductor compound region 206 may be made of or include a metal silicide material, a silicon-germanium-metal-containing material, a germanium-metal-containing material, or a combination thereof. In some embodiments, the metal-semiconductor compound region 206 includes a trace amount of halogen material, such as chlorine. In some embodiments, a portion or an entirety of the modified region 202 reacts with the metal-containing material to form the metal-semiconductor compound region 206.

In some embodiments, while applying or depositing the metal-containing material for forming the metal-semiconductor compound region 206, the metal-containing material is also applied (or deposited) on sidewalls and a bottom surface of the contact opening 120 to form a meal layer 204, as shown in FIG. 2C. In some embodiments, the metal layer 204 also extends on the surfaces of the support elements 112B. The metal layer 204 may be made of or include titanium, nickel, tantalum, cobalt, tungsten, platinum, one or more other suitable materials, or a combination thereof.

Figure 4:
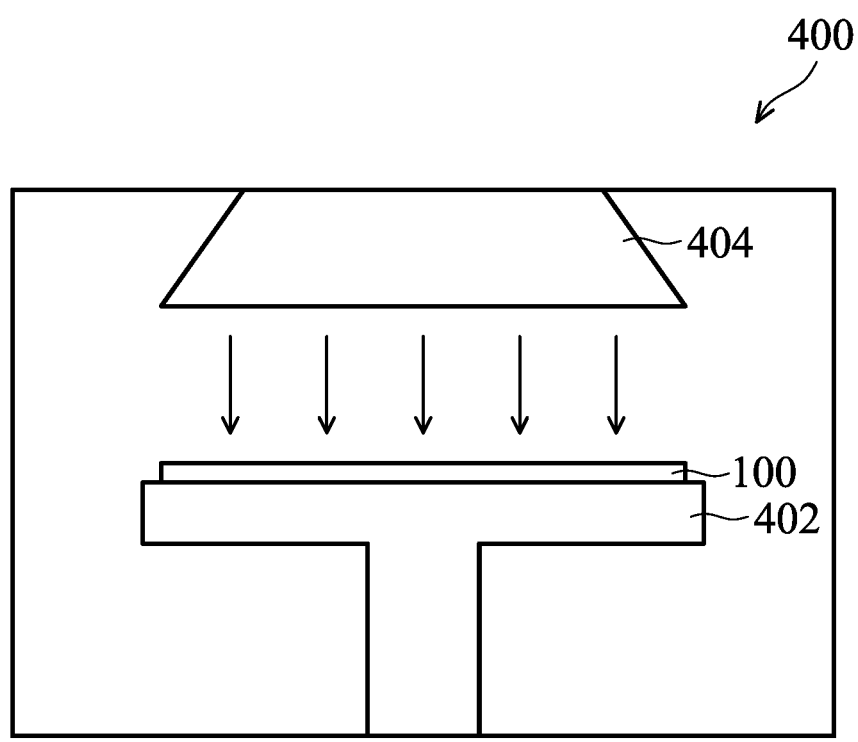
FIG. 4 shows a process chamber for forming a metal-semiconductor compound region, in accordance with some embodiments.

In some embodiments, the metal-containing material is applied (or deposited) using a chemical vapor deposition process. In some embodiments, the metal-containing material is applied (or deposited) using an atomic layer deposition process. FIG. 4 shows a process chamber 400 for forming a metal-semiconductor compound region, in accordance with some embodiments. In some embodiments, the process chamber 400 may be a CVD chamber and/or an ALD chamber used for depositing the metal-containing material. In some embodiments, the structure shown in FIG. 2A is transferred into the process chamber 400 for performing the processes illustrated in FIG. 2B.

The process chamber 400 may include a substrate holder 402 and one (or more) reaction gas provider 404. The substrate holder 402 may be used to hold a substrate for subsequent processes. The substrate holder 402 may also be used as a heater stage for providing thermal energy to the semiconductor substrate 100 and elements formed on the semiconductor substrate 100. The reaction gas provider 404 may provide a mixture of reaction gases that include one or more metal-containing gases. The reaction gas may be used for depositing one or more metal containing materials on the epitaxial structure 116.

As mentioned above, the metal-containing material is applied (or deposited) on the epitaxial structure 116 while the epitaxial structure 116 is heated. In some embodiments, the epitaxial structure 116 is heated to a temperature that is in a range from about 390 degrees C. to about 440 degrees C. In some embodiments, before the metal-containing material is applied (or deposited) on the epitaxial structure 116, the epitaxial structure 116 is heated to be at a raised temperature. Afterwards, the epitaxial structure 116 is kept at the raised temperature while the metal-containing material is applied (or deposited) on the epitaxial structure 116. The raised temperature may be in a range from about 390 degrees C. to about 440 degrees C. In some other embodiments, the process chamber 400 includes a plasma generator to turn a portion of or all of the provided reaction gas into metal-containing plasma.

In some cases where the raised temperature is lower than about 390 degrees C., the metal-containing material may not be able to be deposited successfully. In some other cases where the raised temperature is higher than about 440 degrees C., crystalline phase having a larger resistance, such as C49-TiSi$_2$ or the like may grow in the metal-semiconductor compound region 206. As a result, the electrical connection between the metal-semiconductor compound region 206 and a conductive contact formed later may be negatively affected. In some embodiments, the metal-semiconductor compound region 206 is mainly made of TiSi. In some embodiments, the metal-semiconductor compound region 206 contains substantially no C49-TiSi$_2$.

In some embodiments, the epitaxial structure 116 is kept at a substantially uniform temperature during the deposition of the metal-containing material. However, many variations and/or modifications can be made to embodiments of the disclosure. In some other embodiments, the temperature of the epitaxial structure 116 is increased after the metal-containing material is deposited for a while.

In some embodiments, the metal-containing material is deposited at a first temperature for a first time period. Afterwards, the metal-containing material continues to be deposited at a second temperature for a second time period. The second temperature is higher than the first temperature. The first temperature may be in a range from about 390 degrees C. to about 410 degrees C. The second temperature may be in a range from about 400 degrees C. to about 440 degrees C. The higher second temperature may allow the metal-containing material, which is deposited later, to react with the semiconductor material in the epitaxial structure 116 more easily.

The reaction gas provider 404 may be used to introduce a metal-containing gas, a carrier gas, and one or more other reaction gases into the process chamber 400 while the semiconductor substrate 100 and the epitaxial structure 116 formed thereon are kept at the raised temperature. The metal-containing gas may contain titanium, nickel, tantalum, cobalt, tungsten, platinum, one or more other suitable metal materials, or a combination thereof. For example, the metal-containing gas may include titanium chloride gas or the like. In some embodiments, the one (or more) reaction gas provider 404 provides a gas mixture including titanium chloride gas, hydrogen gas, and argon gas.

In some embodiments, the gas mixture including the metal-containing gas is used to apply or deposit the metal-containing material on the semiconductor substrate 100. The metal-containing material may contain titanium, nickel, tantalum, cobalt, tungsten, platinum, one or more other suitable metal materials, or a combination thereof. For example, the metal-containing material is a titanium-containing material. The titanium-containing material may include titanium and chloride. The titanium-containing material may include pure titanium.

Portions of the metal-containing material in contact with the sidewalls and the bottom surface of the contact opening 120 form the metal layer 204, as shown in FIG. 2C in accordance with some embodiments. A portion of the metal-containing material in contact with the epitaxial structure 116 reacts with the modified region 202 in the epitaxial structure 116 while the epitaxial structure 116 is heated by the substrate holder 402. As a result, the metal-semiconductor compound region 206 is formed, as shown in FIG. 2C.

In some embodiments, the metal-semiconductor compound region 206 is made of or includes TiSi, TiSiGe, TiGe, one or more other suitable materials, or a combination thereof. In some embodiments, the metal-semiconductor compound region 206 is formed once the deposited metal-containing material touches the epitaxial structure 116 which is being heated. Therefore, a subsequent thermal operation (such as a rapid thermal annealing) may not be needed to initiate the reaction for forming the metal-semiconductor compound region 206. Fabrication cost and time may therefore been reduced significantly.

However, many variations and/or modifications can be made to embodiments of the disclosure. In some other embodiments, an optional thermal operation is used to tune the quality of the metal-semiconductor compound region 206.

In some other cases, a metal layer may be deposited over an epitaxial structure using a PVD process. Afterwards, a thermal operation may be used to initiate reaction between the epitaxial structure and the deposited metal layer to form a metal-semiconductor compound region. Higher fabrication cost and time may be used. In some cases, the metal-semiconductor compound region formed using the PVD process and the thermal operation may contain crystalline phase having a larger resistance, such as C49-TiSi$_2$ or the like. The electrical connection between the metal-semiconductor compound region formed using the PVD process and the thermal operation and a conductive contact formed later may be negatively affected.

Figure 2D:
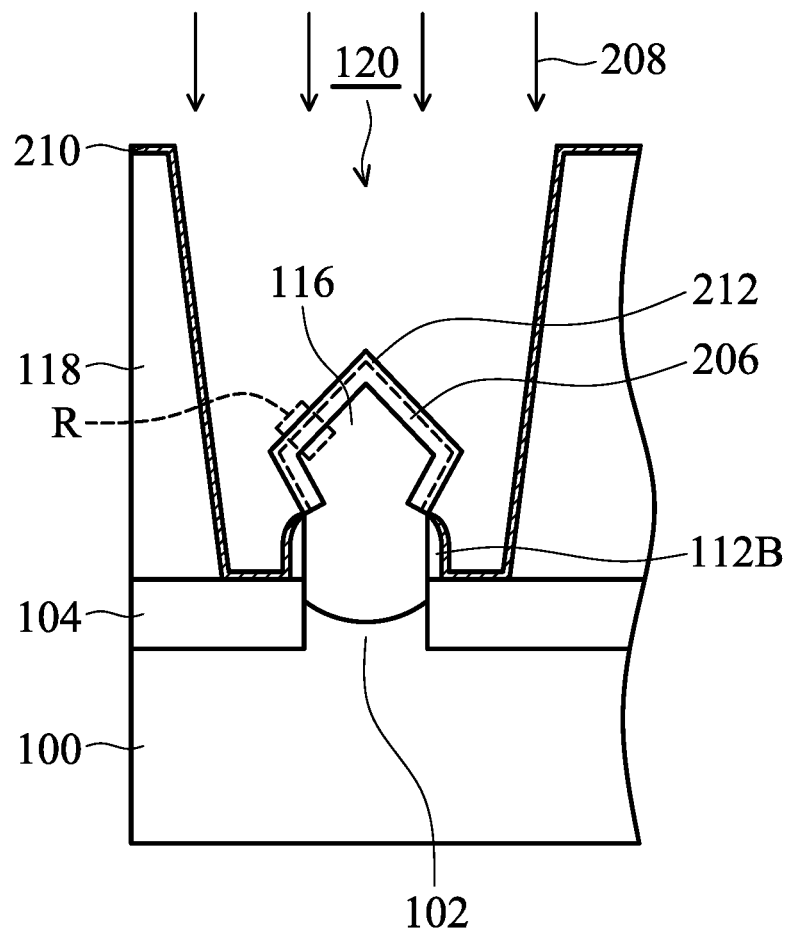

After the formation of the metal-semiconductor compound region 206, a protection region is formed. As shown in FIG. 2D, a modification process 208 is used to form the protection region 212, in accordance with some embodiments. The protection region 212 may prevent the metal-semiconductor compound region 206 from being oxidized and/or damaged during subsequent formation processes. In some embodiments, the metal layer 204 is also modified and transformed into a barrier layer 210. In some embodiments, the barrier layer 210 is also formed using the modification process 208. In these cases, the barrier layer 210 and the protection region 212 are formed simultaneously.

In some embodiments, the modification process 208 is a plasma-involved process. In some embodiments, the modification process 208 is a process involving nitrogen-containing plasma. In some embodiments, the reaction gases used for generating the nitrogen-containing plasma include NH$_3$, N$_2$, Ar, H$_2$, or a combination thereof. In some embodiments, the metal layer 204 is nitrogenized by the modification process 208 to become the barrier layer 210. The barrier layer 210 may be made of or include titanium nitride, tantalum nitride, nickel nitride, cobalt nitride, one or more other suitable materials, or a combination thereof. The barrier layer 210 may be used to prevent metal ions from a subsequently formed conductive contact from entering the dielectric layer 118.

Figure 3:
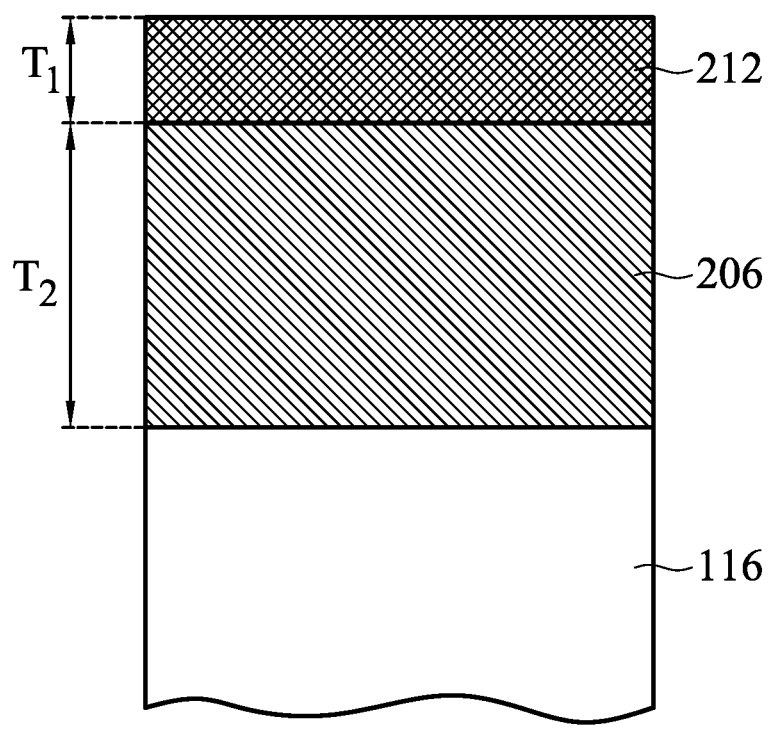
FIG. 3 is a cross-sectional view of a portion of a semiconductor device structure, in accordance with some embodiments.

In some embodiments, an upper portion of the metal-semiconductor compound region 206 is nitrogenized by the modification process 208 to become the protection region 212. FIG. 3 is a cross-sectional view of a portion of a semiconductor device structure, in accordance with some embodiments. In some embodiments, FIG. 3 is an enlarged cross-sectional view showing the region R in FIG. 2D. In some embodiments, the protection region 212 is made of TiSiGeN, TiGeN, one or more other suitable materials, or a combination thereof.

As shown in FIG. 3, the protection region 212 has a thickness $T_1$. The remaining portion of the metal-semiconductor compound region 206, which is not transformed into the protection region, has a thickness $T_2$. In some embodiments, the thickness $T_2$ is greater than the thickness $T_1$. In some embodiments, the thickness ratio of $T_1$ to $T_2$ ($T_1/T_2$) is in a range from about 0.05 to about 0.5.

In some cases, if the thickness ratio $T_1/T_2$ is smaller than about 0.05, the protection region 212 might not be able to prevent the metal-semiconductor compound region 206 from being oxidized and/or damaged during the subsequent processes. In some other cases, if the thickness ratio $T_1/T_2$ is greater than about 0.5, the overall resistance of the metal-semiconductor compound region 206 and the protection region 212 might be too high.

In some embodiments, the protection region 212 has a substantially uniform atomic concentration of nitrogen. In some other embodiments, the atomic concentration of nitrogen in the protection region 212 is not uniform. In some embodiments, a portion of the protection region 212 has an atomic concentration of nitrogen which becomes smaller along a direction towards epitaxial structure 116.

Figure 2E:
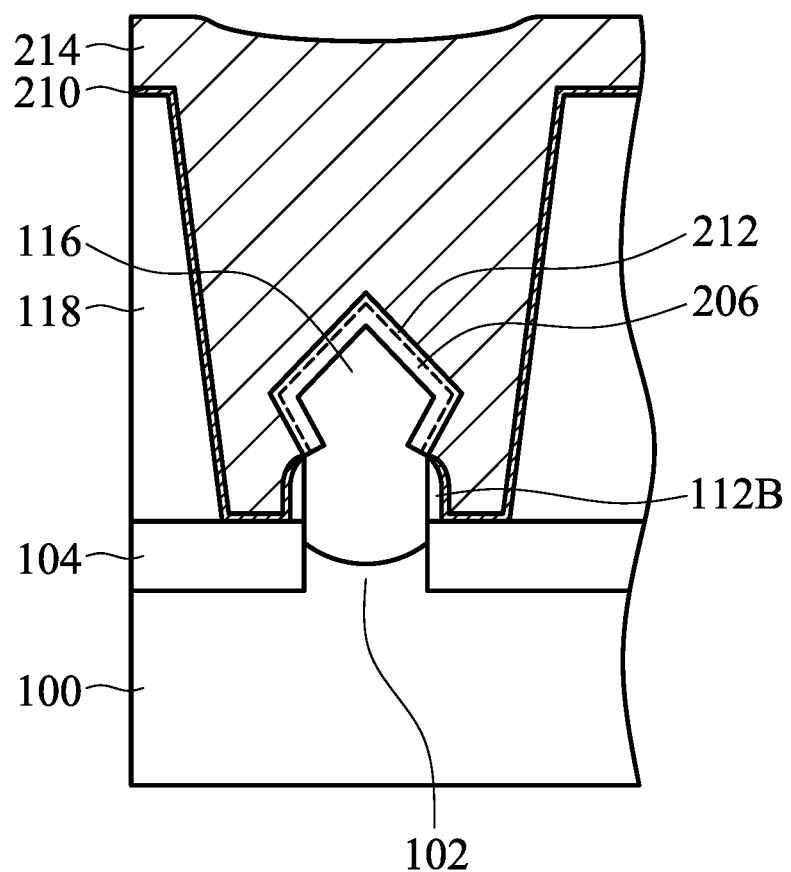

As shown in FIG. 2E, one (or more) conductive material 214 is deposited to overfill the contact opening 120, in accordance with some embodiments. The conductive material 214 may be made of or include tungsten, cobalt, platinum, gold, copper, aluminum, one or more other suitable materials, or a combination thereof. The conductive material 214 may be deposited using a CVD process, a PVD process, an electroplating process, an ALD process, one or more other applicable processes, or a combination thereof.

Figure 2F:
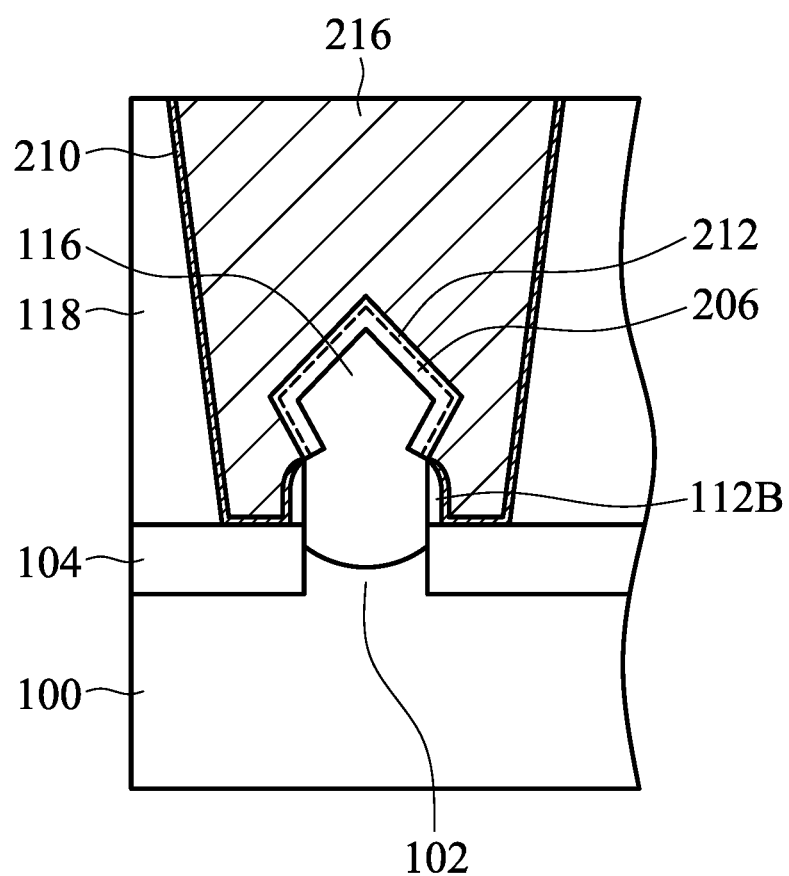

As shown in FIG. 2F, a planarization process is used to remove the conductive material 214 outside of the contact opening 120, in accordance with some embodiments. As a result, a conductive structure 216 is formed, as shown in FIG. 2F. The conductive structure 216 may function as a conductive contact electrically connected to a source/drain structure (i.e., the epitaxial structure 116). The planarization process mentioned above may include a CMP process, a grinding process, an etching process, a dry polishing process, one or more other applicable processes, or a combination thereof.

In some embodiments, the metal-semiconductor compound region 206 is formed using a CVD process or an ALD process. Therefore, the metal-semiconductor compound region 206 extends in a substantially conformal manner along the slanted sidewall surfaces of the epitaxial structure 116, as shown in FIG. 2F. Most portions of the metal-semiconductor compound region 206 have a sufficient thickness. In some embodiments, the entire surface of the epitaxial structure 116 that is originally exposed by the contact opening 120 is covered by the metal-semiconductor compound region 206. Therefore, contact surface between the conductive structure 216 and the metal-semiconductor compound region 206 is large. Accordingly, resistance between the conductive structure 216 and the epitaxial structure 116 is significantly reduced. The performance and reliability of the semiconductor device structure are improved.

Embodiments of the disclosure form a semiconductor device structure with a metal-semiconductor compound region. A CVD or an ALD process is used to deposit a metal-containing material on a semiconductor structure (such as a source/drain epitaxial structure) while the semiconductor structure is kept at a raised temperature. Once the deposited metal-containing material touches the semiconductor structure which is being heated, the metal-semiconductor compound region is formed. A subsequent thermal operation may not be needed. Fabrication cost and time are significantly reduced. The obtained the metal-semiconductor compound region may mainly include crystalline phase with lower resistance. Therefore, resistance between the semiconductor structure and a subsequently formed conductive contact is further reduced due to the metal-semiconductor compound region. The quality and reliability of the semiconductor device structure are greatly improved.

In accordance with some embodiments, a method for forming a semiconductor device structure is provided. The method includes forming a fin structure over a semiconductor substrate and forming a gate stack over the fin structure. The method also includes forming an epitaxial structure over the fin structure, and the epitaxial structure is adjacent to the gate stack. The method further includes forming a dielectric layer over the epitaxial structure and forming an opening in the dielectric layer to expose the epitaxial structure. In addition, the method includes applying a metal-containing material on the epitaxial structure while the epitaxial structure is heated so that a portion of the epitaxial structure is transformed to form a metal-semiconductor compound region.

In accordance with some embodiments, a method for forming a semiconductor device structure is provided. The method includes forming an epitaxial structure over a semiconductor substrate. The method also includes forming a dielectric layer over the epitaxial structure. The method further includes partially removing the dielectric layer to form an opening exposing the epitaxial structure. In addition, the method includes depositing a metal-containing material on the epitaxial structure using a chemical vapor deposition process. The metal-containing material reacts with the epitaxial structure to form a metal-semiconductor compound region.

In accordance with some embodiments, a method for forming a semiconductor device structure is provided. The method includes forming an epitaxial structure over a semiconductor substrate. The method also includes forming a dielectric layer over the semiconductor substrate to cover the epitaxial structure. The method further includes partially removing the dielectric layer to form an opening exposing the epitaxial structure. In addition, the method includes depositing a metal-containing material on the epitaxial structure while the epitaxial structure is kept at a raised temperature. As a result, a metal-semiconductor compound region is formed to surround an inner portion of the epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a fin structure over a semiconductor substrate;
    forming a gate stack over the fin structure;
    forming an epitaxial structure over the fin structure, wherein the epitaxial structure is adjacent to the gate stack;
    forming a dielectric layer over the epitaxial structure;
    forming an opening in the dielectric layer to expose the epitaxial structure; and
    applying a metal-containing material on the epitaxial structure while the epitaxial structure is heated, so that a portion of the epitaxial structure is transformed to form a metal-semiconductor compound region while the metal-containing material is applied on the epitaxial structure being heated at a temperature in a range from about 410 degrees C. to about 440 degrees C.

2. The method for forming a semiconductor device structure as claimed in claim 1, wherein the metal-containing material is applied using a chemical vapor deposition process.

3. The method for forming a semiconductor device structure as claimed in claim 1, wherein the metal-containing material is applied using an atomic layer deposition process.

4. The method for forming a semiconductor device structure as claimed in claim 1, further comprising forming a modified region in the epitaxial structure before the metal-containing material is applied on the epitaxial structure, wherein the modified region has lower crystallinity than an inner portion of the epitaxial structure, and at least a portion of the modified region reacts with the metal-containing material to form the metal-semiconductor compound region.

5. The method for forming a semiconductor device structure as claimed in claim 4, wherein the modified region is formed using an ion implantation process.

6. The method for forming a semiconductor device structure as claimed in claim 1, further comprising forming a conductive structure in the opening, wherein the conductive structure is electrically connected to the metal-semiconductor compound region.

7. The method for forming a semiconductor device structure as claimed in claim 6, wherein the metal-containing material is also applied on the sidewalls of the opening in the dielectric layer to form a metal layer on the sidewalls of the opening.

8. The method for forming a semiconductor device structure as claimed in claim 7, further comprising:
    transforming the metal layer into a barrier layer before the conductive contact is formed; and
    transforming an upper portion of the metal-semiconductor compound region into a protection region.

9. The method for forming a semiconductor device structure as claimed in claim 8, wherein the barrier layer and the protection region are simultaneously formed by applying a nitrogen-containing plasma on the metal layer and the metal-semiconductor compound region.

10. The method for forming a semiconductor device structure as claimed in claim 1, wherein the metal-containing material is deposited at a first temperature for a first time period and deposited at a second temperature for a second time period, and the second temperature is higher than the first temperature.

11. A method for forming a semiconductor device structure, comprising:
    forming an epitaxial structure over a semiconductor substrate;
    forming a dielectric layer over the epitaxial structure;
    partially removing the dielectric layer to form an opening exposing the epitaxial structure; and
    depositing a metal-containing material on the epitaxial structure using a chemical vapor deposition process while the epitaxial structure is heated, wherein the metal-containing material reacts with the epitaxial structure to form a metal-semiconductor compound region while depositing the metal-containing material on the epitaxial structure being heated at a temperature in a range from about 410 degrees C. to about 440 degrees C. using the chemical vapor deposition process.

12. The method for forming a semiconductor device structure as claimed in claim 11, wherein the metal-containing material is a titanium-containing material.

13. The method for forming a semiconductor device structure as claimed in claim 11, wherein the metal-containing material forms a metal layer over sidewalls of the opening.

14. The method for forming a semiconductor device structure as claimed in claim 13, further comprising applying a nitrogen-containing plasma on the metal layer and the metal-semiconductor compound region to transform the metal layer into a barrier layer and to transform an upper portion of the metal-semiconductor compound region into a protection region.

15. The method for forming a semiconductor device structure as claimed in claim 14, wherein the barrier layer comprises titanium and nitrogen, and the protection region comprises silicon, germanium, titanium, and nitrogen.

16. A method for forming a semiconductor device structure, comprising:
    forming an epitaxial structure over a semiconductor substrate;
    forming a dielectric layer over the semiconductor substrate to cover the epitaxial structure;
    partially removing the dielectric layer to form an opening exposing the epitaxial structure; and
    depositing a metal-containing material on the epitaxial structure while the epitaxial structure is kept at a raised temperature such that a metal-semiconductor compound region is formed to surround an inner portion of the epitaxial structure while the metal-containing material is applied on the epitaxial structure being kept at the raised temperature, wherein the raised temperature is in a range from about 410 degrees C. to about 440 degrees C.

17. The method for forming a semiconductor device structure as claimed in claim 16, wherein the metal-containing material is deposited at a first temperature for a first time period and deposited at a second temperature for a second time period, and the second temperature is higher than the first temperature.

18. The method for forming a semiconductor device structure as claimed in claim 16, further comprising reducing crystallinity of a surface portion of the epitaxial structure before the metal-containing material is deposited.

* * * * *